United States Patent
Miller et al.

(10) Patent No.: US 7,221,332 B2
(45) Date of Patent: May 22, 2007

(54) 3D STEREO OLED DISPLAY

(75) Inventors: Michael E. Miller, Honeoye Falls, NY (US); Philip R. Ashe, Rochester, NY (US); John P. Spoonhower, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 535 days.

(21) Appl. No.: 10/742,091

(22) Filed: Dec. 19, 2003

(65) Prior Publication Data

US 2005/0151152 A1      Jul. 14, 2005

(51) Int. Cl.
*G09G 3/00* (2006.01)

(52) U.S. Cl. .............................. 345/32; 345/55; 348/51; 359/462

(58) Field of Classification Search ................ 348/58, 348/42, 51, 54, 59; 345/55, 32; 359/462, 359/463

See application file for complete search history.

(56) References Cited

U.S. PATENT DOCUMENTS

| | | | |
|---|---|---|---|
| 3,180,730 A | 4/1965 | Klupfel et al. ............... 96/1 |
| 3,567,450 A | 3/1971 | Brantly et al. ............... 96/1.5 |
| 3,658,520 A | 4/1972 | Brantly et al. ............... 96/1.5 |
| 4,281,341 A | 7/1981 | Byatt ............................ 358/92 |
| 4,356,429 A | 10/1982 | Tang ............................ 313/503 |
| 4,523,226 A | 6/1985 | Lipton et al. ................ 358/88 |
| 4,539,507 A | 9/1985 | VanSlyke et al. .......... 313/504 |
| 4,720,432 A | 1/1988 | VanSlyke et al. .......... 428/457 |
| 4,768,292 A | 9/1988 | Manzei .......................... 34/70 |
| 4,769,292 A | 9/1988 | Tang et al. ................. 428/690 |
| 4,792,850 A | 12/1988 | Liptoh et al. .............. 358/92 |
| 4,877,307 A | 10/1989 | Kalmanash ................ 350/132 |
| 4,885,221 A | 12/1989 | Tsuneeda ..................... 430/100 |
| 5,059,861 A | 10/1991 | Littman et al. ............. 313/503 |
| 5,059,862 A | 10/1991 | VanSlyke et al. .......... 313/503 |
| 5,061,569 A | 10/1991 | VanSlyke et al. .......... 428/457 |
| 5,141,671 A | 8/1992 | Bryan et al. ............ 252/301.16 |
| 5,150,006 A | 9/1992 | Van Slyke et al. ......... 313/504 |
| 5,151,629 A | 9/1992 | VanSlyke ..................... 313/504 |
| 5,247,190 A | 9/1993 | Friend et al. ................. 257/40 |
| 5,294,870 A | 3/1994 | Tang et al. ................. 313/504 |
| 5,405,709 A | 4/1995 | Littman et al. ............. 428/690 |
| 5,484,922 A | 1/1996 | Moore et al. ................. 546/7 |
| 5,593,788 A | 1/1997 | Shi et al. .................... 428/690 |
| 5,608,287 A | 3/1997 | Hung et al. ................. 313/503 |
| 5,645,948 A | 7/1997 | Shi et al. .................... 428/690 |

(Continued)

FOREIGN PATENT DOCUMENTS

EP       0 891 121 A1       1/1999

(Continued)

*Primary Examiner*—Amr A. Awad
*Assistant Examiner*—Seokyun Moon
(74) *Attorney, Agent, or Firm*—Stephen H. Shaw

(57) ABSTRACT

A switchable stereoscopic display system, wherein the switchable stereoscopic display system can display two-dimensional and three-dimensional images, includes: an organic light emitting diode (OLED) display device; Electronics that rapidly updates individual OLEDs; and a linearly polarizer for the OLED display device. Additionally, a circular polarizing layer changes light from linearly polarized light to circular polarized light. A polarization layer, on top of the circular polarization layer, switches a polarization direction of emitted light within the OLED display device. Other electronics switches the polarization direction within independent segments of the polarization layer. Refreshed OLEDs are synched with the independent segments of the polarization layer.

16 Claims, 4 Drawing Sheets

U.S. PATENT DOCUMENTS

| | | | |
|---|---|---|---|
| 5,677,572 A | 10/1997 | Hung et al. | 257/750 |
| 5,683,823 A | 11/1997 | Shi et al. | 428/690 |
| 5,686,975 A | 11/1997 | Lipton | 349/15 |
| 5,703,436 A | 12/1997 | Forrest et al. | 313/506 |
| 5,714,838 A | 2/1998 | Haight et al. | 313/506 |
| 5,739,545 A | 4/1998 | Guha et al. | 257/40 |
| 5,755,999 A | 5/1998 | Shi et al. | 252/301.16 |
| 5,776,622 A | 7/1998 | Hung et al. | 428/690 |
| 5,776,623 A | 7/1998 | Hung et al. | 428/690 |
| 5,837,391 A | 11/1998 | Utsugi | 428/690 |
| 5,844,717 A | 12/1998 | Faris | 359/483 |
| 5,851,709 A | 12/1998 | Grande et al. | 430/7 |
| 5,928,802 A | 7/1999 | Shi et al. | 428/690 |
| 5,935,720 A | 8/1999 | Chen et al. | 428/690 |
| 5,935,721 A | 8/1999 | Shi et al. | 428/690 |
| 5,956,001 A * | 9/1999 | Sumida et al. | 345/55 |
| 5,969,474 A | 10/1999 | Arai | 313/504 |
| 5,981,306 A | 11/1999 | Burrows et al. | 438/22 |
| 6,020,078 A | 2/2000 | Chen et al. | 428/690 |
| 6,020,941 A | 2/2000 | Ma | 349/15 |
| 6,066,357 A | 5/2000 | Tang et al. | 427/66 |
| 6,137,223 A | 10/2000 | Hung et al. | 313/506 |
| 6,140,763 A | 10/2000 | Hung et al. | 313/503 |
| 6,172,459 B1 | 1/2001 | Hung et al. | 313/506 |
| 6,208,075 B1 | 3/2001 | Hung et al. | 313/504 |
| 6,226,890 B1 | 5/2001 | Boroson et al. | 34/472 |
| 6,237,529 B1 | 5/2001 | Spahn | 118/726 |
| 6,278,236 B1 | 8/2001 | Madathil et al. | 313/504 |
| 6,358,631 B1 | 3/2002 | Forrest et al. | 428/690 |
| 6,359,664 B1 | 3/2002 | Faris | 349/15 |
| 6,437,915 B2 * | 8/2002 | Moseley et al. | 359/465 |
| 6,459,532 B1 | 10/2002 | Montgomery et al. | 359/462 |
| 6,485,884 B2 | 11/2002 | Wolk et al. | 430/200 |
| 7,046,271 B2 * | 5/2006 | Doerfel et al. | 348/51 |
| 2002/0075566 A1 | 6/2002 | Tutt et al. | 359/619 |
| 2002/0158574 A1 | 10/2002 | Wolk et al. | 313/504 |
| 2002/0180659 A1 | 12/2002 | Takahashi | 345/4 |
| 2003/0179626 A1 * | 9/2003 | Sanford et al. | 365/200 |
| 2004/0012851 A1 * | 1/2004 | Sato et al. | 359/464 |
| 2004/0239231 A1 * | 12/2004 | Miyagawa et al. | 313/438 |

FOREIGN PATENT DOCUMENTS

| | | |
|---|---|---|
| EP | 1 009 041 A2 | 6/2000 |
| EP | 1 029 909 A1 | 8/2000 |
| EP | 1 076 368 A2 | 2/2001 |
| WO | WO 98/55561 | 6/1998 |
| WO | WO 00/57676 | 3/2000 |
| WO | WO 00/18551 | 4/2000 |
| WO | WO 00/70655 | 5/2000 |

* cited by examiner

3D STEREO OLED DISPLAY

FIELD OF THE INVENTION

The invention relates generally to the field of Organic Light Emitting Diode (OLED) Displays, and in particular to Stereoscopic OLED displays. More specifically, the invention relates to an OLED display that provides a stereoscopic image using polarized light.

BACKGROUND OF THE INVENTION

Organic Light Emitting Diode (OLED) displays are known in the art. These displays are typically formed from a two-dimensional array of light emitting OLEDs. These solid-state emissive displays typically provide a high contrast ratio for static and dynamic patterns and wide viewing angle, thus providing a very high quality two-dimensional image.

Stereoscopic displays are also known in the art. These displays may be formed using a number of techniques; including barrier screens such as discussed by Montgomery in U.S. Pat. No. 6,459,532 and optical elements such as lenticular lenses as discussed by Tutt et al in U.S. Patent Application 2002/0075566. Each of these techniques concentrates the light from the display into a narrow viewing angle, providing an auto-stereoscopic image. Unfortunately, these techniques typically reduce the perceived spatial resolution of the display since half of the columns in the display are used to display an image to either the right or left eye. These displays also reduce the viewing angle of the display, reducing the ability for multiple users to share and discuss the stereoscopic image that is being shown on the display.

Among the most commercially successful stereoscopic displays to date have been displays that either employed some method of shuttering light such that the light from one frame of data is able to enter only the left or right eye and left and right eye images are shown in rapid succession. Two methods have been employed in this domain; including displays that employ active shutter glasses or passive polarizing glasses. Systems employing shutter glasses display either a right or left eye image while an observer wears active LCD shutters that allow the light from the display to pass to only the appropriate eye. While this technique has the advantage that it allows a user to see the full resolution of the display and allow the user to switch from a monoscopic to a stereoscopic viewing mode, the update rate of the display is typically on the order of 120 Hz, providing a 60 Hz image to each eye. At this relatively low refresh rate, most observers will experience flicker resulting in significant discomfort if the display is used for more than a few minutes within a single viewing session. Even when the display is refreshed at significantly higher rates, flicker is often visible when the display is large and/or high in luminance.

Displays employing polarization have also been discussed and employed. For example, Wolk et al in U.S. Pat. No. 6,485,884 has discussed the design and manufacture of an OLED display that emits linear polarized light and that can be used to provide a stereoscopic display. Using this approach, the organic materials are oriented when patterned onto the substrate such that they emit linearly polarized light. When these materials are patterned such that alternating columns have different linear polarizations and the observer wears glasses in which each lens has a different linear polarization, each eye sees the light from alternating columns in the display. Using this display, a stereoscopic image can be displayed with every other column of pixels from the left and right eye images being displayed on alternating columns of the display. While this method provides a stereoscopic image, the resulting stereoscopic image has half the spatial resolution of display. Since the polarization is permanently fixed during the manufacture of the display, alternating columns on this display always have different polarizations and alternating columns will vary significantly in appearance when the display is viewed without polarized glasses that provide the stereoscopic effect, making the display of little use when viewed without appropriately polarized glasses. Further, it is well known that stereoscopic displays formed using linear polarization suffer from a number of artifacts; including narrowing of display's viewing angle and cross-talk (i.e., leakage of light intended for one eye to the other eye) when the linear polarized glasses are turned to an angle other than perpendicular to the columns of the display.

It is known in the art that displays employing circularly polarized light provide many advantages over displays that employ linear polarized displays. Specifically, these displays do not suffer from significantly increased cross-talk when the observer tilts his or her head. These displays typically provide a linear polarizing layer, a quarter-wave plate to create circularly polarized light, and a switchable or patterned half-wave plate to rotate the handedness of the polarization for half of the image. Byatt, 1981 (U.S. Pat. No. 4,281,341) has described a system employing a switchable polarizer that is placed in front of a CRT and performs very similarly to shutter glasses, using the polarization to select which eye will see each image. This system has the advantage over shutter glasses that the user does not need to wear active glasses, but otherwise suffers from the same deficiencies, including flicker.

Lipton, 1985 (U.S. Pat. No. 4,523,226) described a display system that will not suffer from flicker, but instead uses two separate video displays and optics to present the images from the two screens appropriately for the two eyes. While this display system does not suffer from the same visual artifacts as the system employing switchable polarization that was described by Byatt, the system requires two separate visual displays and additional optics, providing increasing the cost of such a system.

Circular polarization has also been used in systems to provide lower resolution images without flicker, using an approach that is similar to that employed in barrier screen displays. Lipton 1997 (U.S. Pat. No. 5,686,975) and Ma, 2000 (U.S. Pat. No. 6,020,941) each describe display systems where alternating columns of a display device are each provided with circular polarizers that are arranged in columns, such that alternating columns provide light that is circularly polarized with left and right handed orientation. By changing the handedness of the polarization in this way, and by wearing polarized glasses, each eye is provided alternating columns of the information from the display. However, as the handedness of the polarization of the light is kept constant during display of stereoscopic imagery, the resolution is reduced due to the fact that each eye can only see half of the columns of the display while viewing stereoscopic imagery. Faris, 1998 (U.S. Pat. No. 5,844,717) and Faris, 2002 (U.S. Pat. No. 6,359,664) have described similar displays that provide stereoscopic images by arranging a two-dimensional array of micropolarizers on a display surface with each eye being able to see a checkerboard pattern of the image. These micropolarizers are static and therefore each of the observers' eyes once again see only half the resolution of the display. It is notable, that since each eye sees only half the area of the display, the perceived brightness of the display is also reduced by a factor of two. These polarized displays suffer from one additional constraint due to the fact that the transmission of the polarizing layer is wavelength dependent. Because of this effect, the color purity of the display and often the viewing angle is reduced by the presence of the polarizer as different colored pixels of light pass through a single polarizer that has not been optimized to transmit the luminance at the center wavelength of the emitted light.

Kalmanash in U.S. Pat. No. 4,877,307 discussed the wavelength sensitivity of the circular polarizing layer and proposed a CRT with three sheets of circular polarizers that are stacked between a linear polarizing layer and an active retarder for manipulating the handedness of the polarization. In this display device, each of the circular polarizing layers are composed of materials having a center wavelength that is matched to the peak wavelength of the red, green, and blue emitters in the display device. This stack of three circular polarizing layers was proposed to improve the circular polarization of the colored light from the three-color display. Unfortunately, Kalmanash does not address the problem that each of the circular polarizers can affect polarization over a range of wavelengths and therefore the circular polarizers at the top of the stack may interfere with and, for some wavelengths of the light, will reduce the circular polarization that is introduced by the circular polarizers at the bottom of the stack. Kalmanash also fails to solve the problem that the active half-wave retarded that is used to rotate the handedness of the circular polarization is also highly wavelength dependent and is therefore incapable of fully changing the handedness of circular polarized light that includes a broad range of wavelengths with multiple peaks as is common within a color imaging device.

PROBLEM TO BE SOLVED BY THE INVENTION

The present invention solves problems related to stereoscopic displays including cost, perceived spatial resolution, viewing angle distortion, and reduced brightness.

SUMMARY OF THE INVENTION

The present invention is directed to overcoming one or more of the problems set forth above. Briefly summarized, one aspect of the present invention provides a switchable stereoscopic display system, wherein the switchable stereoscopic display system can display two-dimensional and three-dimensional images, that includes an organic light emitting diode (OLED) display device; a first electronic means for rapidly updating individual OLEDs; and means for linearly polarizing the OLED display device. Also included in the present invention are a circular polarizing layer capable of changing light from linearly polarized light to circular polarized light; a polarization layer, on top of the circular polarization layer, and capable of switching a polarization direction of emitted light within the OLED display device; a second electronic means for causing the switching of polarization direction within independent segments of the polarization layer; and synchronization means for synching refreshed OLEDs with the independent segments of the polarization layer.

ADVANTAGEOUS EFFECT OF THE INVENTION

The present invention has the advantage of providing a stereoscopic OLED display with full spatial resolution, without perceptible artifacts such as flicker and cross talk. The present invention will ideally have a large color gamut and viewing angle as it will effectively produce and alter the handedness of circularly polarized light from a full color display.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein:

FIG. 6b is a schematic diagram illustrating a cross section of a display device depicting the structure underlying the pixels shown in FIG. 6a.

To facilitate understanding, identical reference numerals have been used, where possible, to designate identical elements that are common to the figures.

DETAILED DESCRIPTION OF THE INVENTION

Figure 1:
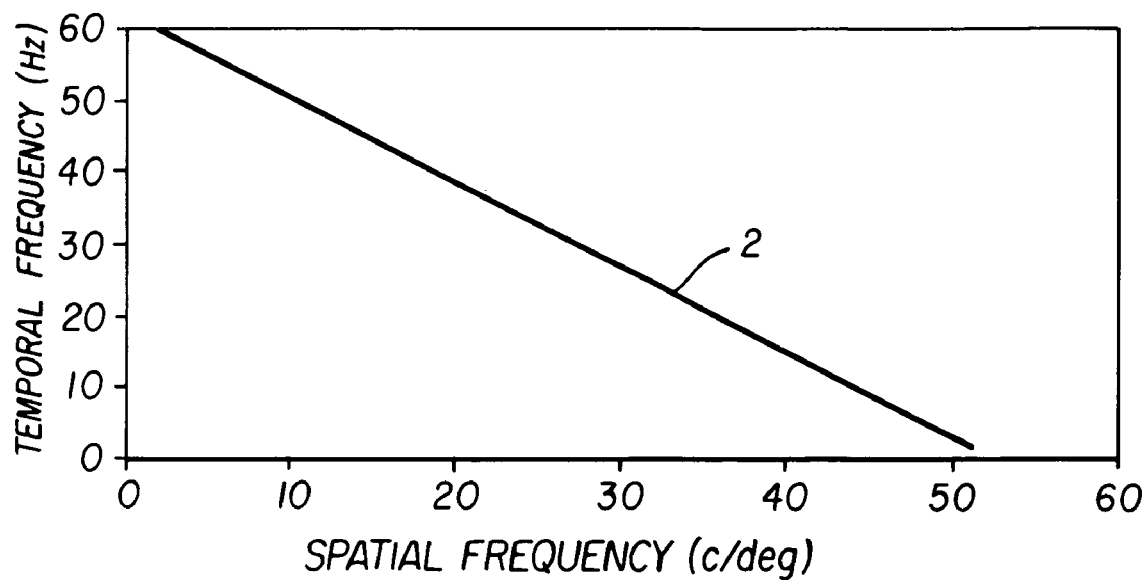
FIG. 1 is a graph showing the temporal frequency required for a user to perceive a flashing light as not flickering as a function of the spatial frequency of the light source.

The invention described herein takes advantage of the fact that while the human visual system is sensitive to patterns that are displayed with high temporal frequency when these patterns are displayed with low spatial frequency, the human visual sensitivity has relatively low sensitivity to patterns that are displayed with high temporal frequencies when the spatial pattern is also high in frequency. FIG. 1 shows a function 2, which is plotted based upon equations provided in Yang and Makous, 1994 ("Spatiotemporal separability in contrast sensitivity", *Vision Research* 34(19), pp. 2569-2576) and depicts the temporal frequency at which a typical human observer can detect flicker as a function of the spatial frequency of the pattern that is being displayed. As is well known in the art of visual psychophysics, the temporal frequency that is required to make a flashing light appear without flicker decreases as the spatial frequency of the flickering light increases. For this reason, when the luminance over an entire display is updated in unison, the display surface has a low spatial frequency and a high temporal frequency must be obtained to avoid the perception of flicker. However, if the luminance of a high frequency pattern is updated, the pattern has a higher spatial frequency and lower temporal frequencies are required to avoid the perception of flicker.

Looking at FIG. 1, if a pattern is displayed, such that the spatial pattern is such that the spatial frequency is less than 10 c/deg, as is typical when an entire display is updated in a single refresh cycle, the update cycle will have to occur with a temporal frequency of greater than 50 Hz to avoid the perception of flicker. However, if every other column of a high-resolution display is updated in one update cycle, this pattern will typically have a spatial frequency of 30 c/deg or higher and update cycles with temporal frequencies of less than 30 Hz may be used without producing the perception of flicker. It should be noted that the function shown in FIG. 1 is one of a family of functions that vary as a function of other display characteristics. For example, different functions may be drawn for displays as a function of display luminance with higher sensitivities occurring for displays with higher luminance output. Depending upon the luminance, the size of the display device, the ideal update rates that produce a displayed image without flicker for a spatial pattern that is significantly higher than the spatial frequency of the display itself will typically be between 15 and 70 Hz.

Figure 2:
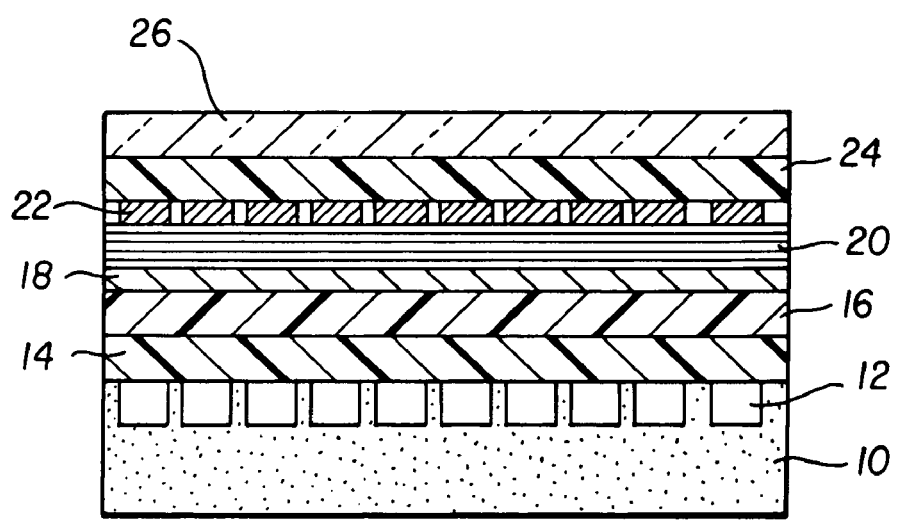
FIG. 2 is a schematic diagram showing the vertical structure of a display device according to one embodiment of the present invention.

This property of the human visual system may be exploited to form a stereoscopic flat panel display as shown in FIG. 2. FIG. 2 shows a side view of a monochrome display device of the present invention. As shown in this figure, the display device 10 is composed of a two-dimensional array of light emitting elements 12. The display device 10 is coated with an optional linear polarizer 14 and a circular polarizer 16, a first transparent electrical conductive layer 18, and a switchable half wave plate 20 that may be used to reverse the handedness of the circular polarization. A second conductive layer 22 is formed in columns over the columns of two-dimensional array of light emitting elements 12. This layer may then be covered with a dielectric layer 24, a protective layer 26 and an optional anti-glare coating 26.

The display device 10 may be any solid state display device including plasma displays capable of forming a two dimensional image to a human observer and updating the image such that the information in each column of the display is updated synchronously with the switchable half wave plate. However, the display device 10, will ideally be an OLED display device. These display devices may include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT). There are numerous configurations of the organic layers wherein the present invention can be successfully practiced.

Figure 3:
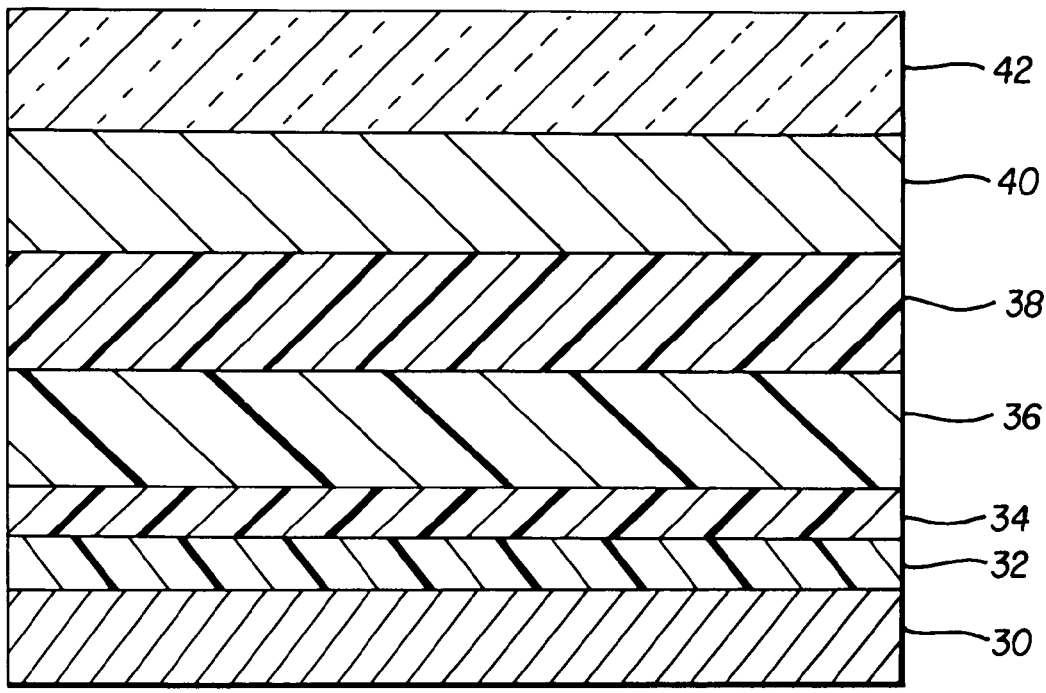
FIG. 3 is a schematic diagram illustrating a cross section of a series of OLEDs according to one embodiment of the present invention.

A cross section of a typical light emitting OLED is shown in FIG. 3. As shown in this figure, the emitting element is comprised of a cathode layer 30, an electron-transporting layer 32, a light-emitting layer 34, a hole-transporting layer 36, an optional hole-injecting layer 38, an anode layer 40 and a substrate 42. Note that the substrate 42 may alternatively be located adjacent to the cathode 30, or the substrate may actually constitute the anode 40 or cathode 30. The organic layers between the anode and cathode are conveniently referred to as the organic EL element.

The OLED device of this invention is typically provided over a supporting substrate 42 where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course it is necessary to provide in these device configurations a light-transparent top electrode.

When EL emission is viewed through anode 40, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

It is often useful to provide a hole-injecting layer 38 be provided between anode 40 and hole-transporting layer 36. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

The hole-transporting layer 36 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]-p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in U.S. Pat. Nos. 4,769,292 and 5,935,721, the light-emitting layer (LEL) 34 of the organic EL element includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc(II)
CO-4: Bis(2-methyl-8-quinolinolato)aluminum(III)-µ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]

Other classes of useful host materials include, but are not limited to: derivatives of anthracene, such as 9,10-di-(2-naphthyl)anthracene and derivatives thereof, distyrylarylene derivatives as described in U.S. Pat. No. 5,121,029, and benzazole derivatives, for example, 2,2', 2"-(1,3,5-phenylene)tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Preferred thin film-forming materials for use in forming the electron-transporting layer 32 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

In some instances, layers 32 and 34 can optionally be collapsed into a single layer that serves the function of supporting both light emission and electron transport. These layers can be collapsed in both small molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

When light emission is viewed solely through the anode, the cathode 40 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in the following patents: U.S. Pat. No. 4,885,211, U.S. Pat. No. 5,247,190, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, and U.S. Pat. No. 6,278,236. Cathode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method (U.S. Pat. No. 6,066,357).

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, or providing colored, neutral density, or color conversion filters over the display.

To achieve circular polarization of the light that is emitted from the OLED display, it is first necessary to achieve linearly polarized light. In this display device, the light may become linearly polarized by passing the light through a coating that acts as a quarter-wave plate to linearly polarize the light. This layer is referred to as the linear polarizing layer 14. This layer will generally be deposited as a single coating layer across the entire surface of the display and can be composed of any material that provides linear polarization.

Alternatively to providing a linear polarizing layer in an OLED display, the OLED materials may be deposited such that the light emitting molecules are aligned to emit linear polarized light. This may be achieved by applying the method described in U.S. Pat. No. 6,485,884 or any other acceptable method.

The linear polarized light is circularly polarized by passing it through a half wave plate. This circular polarizing layer 16 will also normally be deposited as a sheet across the monochrome display device but may also be deposited in columns or in a two-dimensional array across the display device. This circular polarizer will ideally be achromatic, allowing similar performance for all wavelengths within the visible spectrum, however, since these layers are typically not achromatic, the center wavelength of this material will be matched to the color of the light emitting element(s) of the display that this material covers. As will be discussed in more detail later, when covering a full color display, this layer may be formed from columns or other patterns of different materials with different center wavelengths where the wavelength of the material is matched to the emission of the light emitting element(s) that it covers.

The first conductive layer 18 and the second conductive layer 22 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. Desired anode materials are commonly deposited by any suitable means such as evaporation, sputtering, chemical vapor deposition, or coating.

One or more of these layers will ideally be patterned into segments wherein each segment covers a subset of the pixels in the display. Ideally, each segment will cover a column of light emitting elements in the display. However, it may cover any individual light emitting element or some arrangement of a number of light emitting elements on the display device.

The switchable half-wave plate 20 may be provided by any material that is capable of switching the direction of polarization of the circularly polarized light. Such a switchable layer may be provided by liquid crystal materials. These materials may include bi-stable cholesteric, neumatic, and ferroelectric liquid chrystalized materials that are capable of changing the handedness of the polarization of the circularly polarized light. This waveplate will ideally be achromatic, allowing similar performance for all wavelengths within the visible spectrum. However, since the many of the materials available to create this layer are not achromatic, the center wavelength of this material will be matched to the color of the light emitting element(s) of the display that this material covers. As will be discussed in more detail later, when covering a full color display, this layer may be formed from columns or other patterns of different materials with different center wavelengths where the wavelength of the material is matched to the emission of the light emitting element(s) that it covers. This material layer, as well as the conductive layers, may be patterned such that each column or other arrangement of light emitting elements 12 in the display device 10 emit light through a column of the switchable half-wave plate 20.

The dielectric layer 22 will provide electrical isolation between the segments of the patterned conductive layers and the front surface of the device. This dielectric layer can be formed as a sheet over the front of the device.

The protective layer 24 will be any layer that will provides protection to the materials in the stack between the display OLED display device and the front of the display materials. This protective layer will typically be a durable coating such as PET which provides mechanical stabilization of the materials.

The anti-glare layer 26 may be any material that reduces glare from incident light from being reflected from the front surfaces of the display device stack. This layer may also be a surface treatment that is applied to the protective layer to produce diffuse reflection of highly specular beams of incident light.

Within the preferred embodiment of this invention, the display device 10 and the switchable half wave plate 20 are driven synchronously. To display a stereoscopic image the handedness of the polarization of light emitted by a column of the light emitting elements within the display device may be changed at the same time new data is clocked into a column of the light emitting elements. Under ideal conditions, the light emitting elements would be switched to produce no light emission, the handedness of the polarization of the half wave plate will be changed and the column of light emitting elements would be switched to produce light emission for the next frame of data. This allows time for the handedness of the polarization of the half wave plate to be switched before the next frame of information is displayed on the light emitting elements. This drive scheme compensates for the fact that materials used to create a switchable half wave plate are often composed of large molecules in a liquid or semi-liquid matrix which require some time to rotate, allowing unpolarized or incorrectly polarized light to unintentionally "leak" from the display device. Since the light emitting elements are ideally composed of OLED or similar materials that have a very fast response rate, the light emission from these materials can be switched on or off instantaneously, preventing unintentional light to leak from the display device. Alternatively, the handedness of the polarization of the half wave plate for a column will can be changed at the time that data is beginning to be clocked into the column of light emitting elements.

Figure 4:
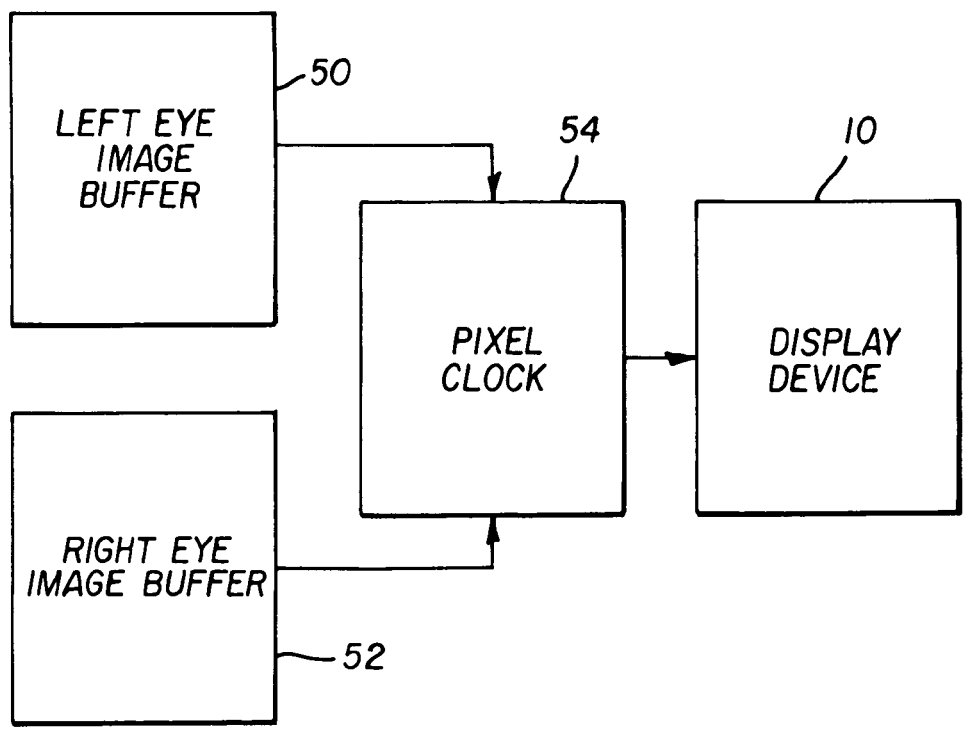
FIG. 4 is a diagram depicting one embodiment of a display system of the present invention.

The display device of the present invention is employed in a display system as shown in FIG. 4. The display system is composed of a image buffer for the left eye image 50, an image buffer for the right eye image 52, a pixel clock 54 produces a timing signal to clock the data from the image buffers into drivers that are integrated in the display device 10. The signal to drive the handedness of the polarization by changing the electrical signal to the second conductive layer may be produced by the drivers in the display. Alternatively, a circuit may be built to determine when data is to be clocked into a new column of the display and to change the electrical signal to the second conductive layer 22 in order to change the handedness of the polarization provided by the switchable half wave plate 20.

Figure 5:
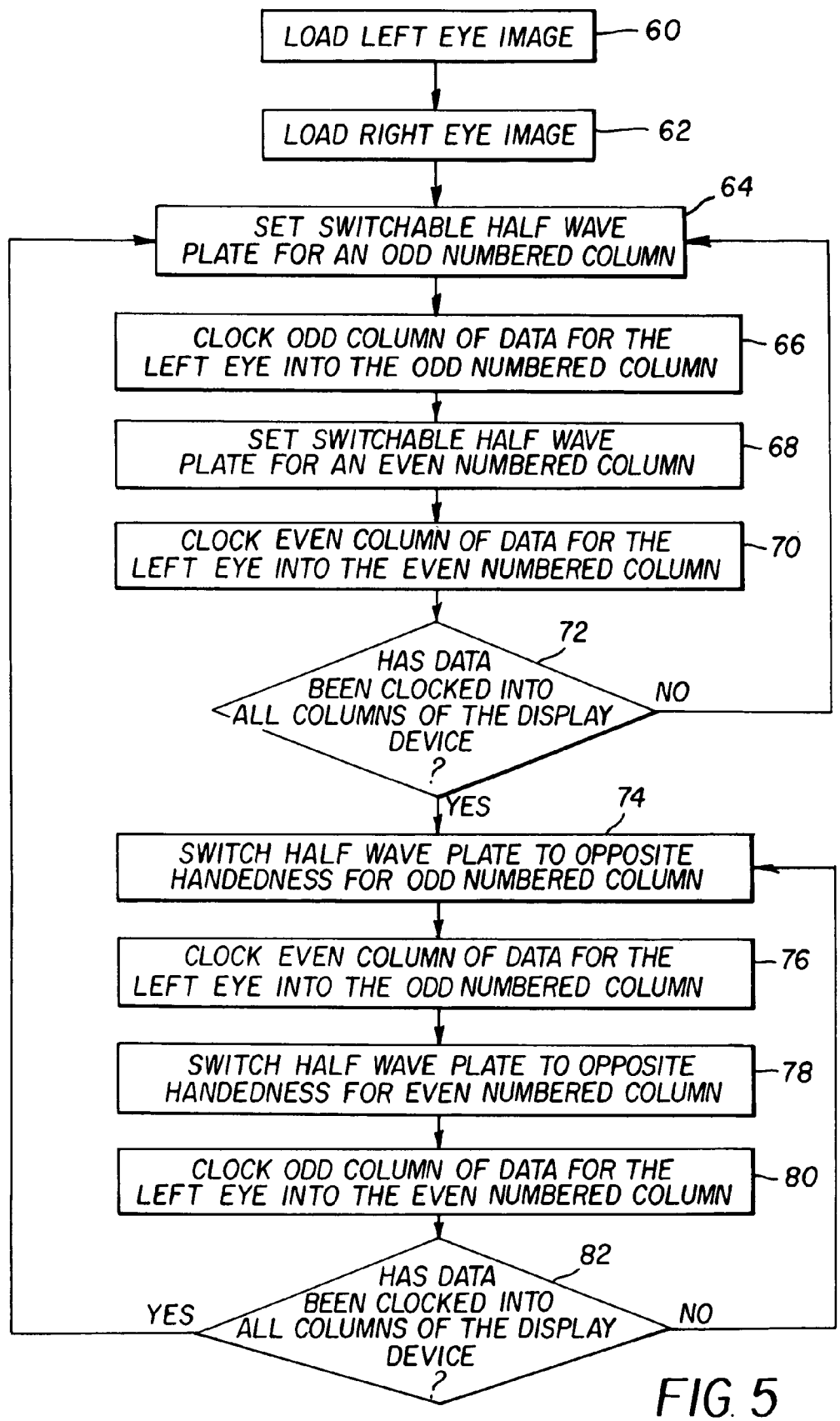
FIG. 5 is a flow chart illustrating the process of displaying an image on a display device of the present invention.

Using these components, a stereoscopic image is displayed as shown in FIG. 5. An image to be displayed to the left eye is loaded 60 into the image buffer for the left eye 50 and an image to be displayed to the right eye is loaded 62 into the image buffer for the right eye 52. The switchable half wave plate 20 for the first column of the display device 10 is set 64 to adjust the circular polarization of the first column is to a first handedness of the polarization and the first column of data in the image buffer for the left eye 50, the data is clocked 66 into the first column of the display device 10. The switchable half wave plate 20 for the second column of the display is set 68 to adjust the circular polarization of the second column to a second handedness of the polarization and the second column of data in the image buffer for the right eye 52 is then clocked 70 into the second column of the display device 10. If all of the columns of the display have not been filled 72 the process is repeated, setting 64 the switchable half wave plate 20 for each odd column of the display device 10 to a first handedness of the polarization, clocking 66 each odd numbered column of data from the image buffer for the left eye 50 into each odd number of the display device 10, setting 68 the switchable half wave plate 20 for each even column of the display device to a second handedness of the polarization, and clocking 70 each odd numbered column of data from the image buffer for the right eye 52 into the even numbered column of the display device.

Once each column of the display device 10 has been filled 72, switchable half wave plate 20 for the first column of the display device 10 is set 74 to adjust the circular polarization of the first column to the second handedness of the polarization and the first column of data in the image buffer for the right eye 52 is clocked 76 into the first column of the display device. The switchable half wave plate 20 for the second column of the display is set 78 to adjust the circular polarization of the second column to the first handedness of the polarization and the second column of data in the image buffer for the left eye 52 is then clocked 80 into the second column of the display device 10. If all of the columns of the display have not been filled 82 the process is repeated, setting 74 the switchable half wave plate 20 for each odd column of the display device 10 to the second handedness of the polarization, clocking 76 each odd numbered column of data from the image buffer for the right eye 52 into each odd number of the display device 10, setting 78 the switchable half wave plate 20 for each even column of the display device to the first handedness of the polarization, and clocking 80 each odd numbered column of data from the image buffer for the left eye 50 into the even numbered column of the display device. Once all of the columns of the display device have been filled 82 for a second time an update cycle is completed and, the process is repeated.

For an observer to see half of the columns of the image in one eye and the other half in the other eye in order to allow a stereoscopic image to be displayed, circularly polarized elements must be placed between the display device 10 and the observers' eyes. Each of these elements will have opposing polarization. Therefore, in one cycle, the left eye of the observer will see the even numbered columns of the display in a single update cycle while the right eye will see the odd numbered columns of the display. For this reason, each eye will be presented with an image that has half the resolution of the display device. However, since the image is altered during the next update cycle such that the columns that were not visible in one update cycle are visible during the second update cycle and these update cycles are typically completed at a rate of $1/30^{th}$ or $1/42^{nd}$ of a second the two frames are integrated as a single image by the human visual system. Therefore, this display system avoids the perception of flicker and increases the perceived resolution of the display device 10 in such a way to take advantage of the spatial-temporal integration properties of the human eye. Therefore, the human eye will see each of the columns of pixels as though they are turned on constantly except, the display will appear only half as bright as it would if the observer was really able to see every light emitting element at every moment in time.

While the display system of the present invention may be driven using the process shown in FIG. 4 to create a stereoscopic display system when viewed with a pair of glasses with circularly polarized elements, this same display device can be driven to allow a monoscopic image to be viewed when the circular polarized elements are not placed between the display device 10 and the observers' eyes. This may be achieved by setting the handedness of the polarization of every column of the switchable half wave plate 20 to a single handedness of the polarization and displaying an image from a single image buffer on the display device 10. While the display device 10 may be switched from stereoscopic to monoscopic using any switching technology, a sensor, for example an infrared sensor, may be attached to the display device and positioned to view an area that is consistent with the user's typical head position. An illumination source, for example an infrared light emitting diode, may then be attached to frames of the passive polarizing glasses that need to be worn by the user to see a stereoscopic image. The display device may then operate in stereoscopic mode anytime the infrared light emitting diode is visible to the illumination source and operate in monoscopic the infrared light emitting diode is not visible to the infrared sensor.

While this embodiment has been described with respect to a monochrome display, this same structure and drive scheme may be applied to any monochrome or color display. It should, however, be noted that while the circular polarizer 16 and the switchable half wave plate 20 are ideally achromatic, it is known that these layers may each be constructed from liquid crystal materials which are typically not achromatic. In fact it is well known that when a liquid crystal in the "on state" is illuminated with ambient light, the liquid crystal reflects light that has the same handedness as the liquid crystal and that is within an intrinsic spectral bandwidth centered about a single wavelength; some proportion of all other wavelengths of incident light, and light of opposite handedness of the polarization, is transmitted through the liquid crystal. Therefore, if the same liquid crystal material is used to polarize the light from light emitting elements with different spectral emission peaks, and therefore different colors, the display will be more efficient in transmitting the light from some light emitting elements than from others. Further, the liquid crystal layers will introduce a color shift that is dependent upon drive level of the individual light emitting elements. Since the color science that is embedded in most electronic displays, assume that the color of the display system can be modeled as an additive system in which the color of the individual light emitting elements does not change as a function of drive level, to create a display system that is calorimetrically accurate one would have to develop specialized and significantly more complex image processing to correct for this display artifact.

Figure 6A:
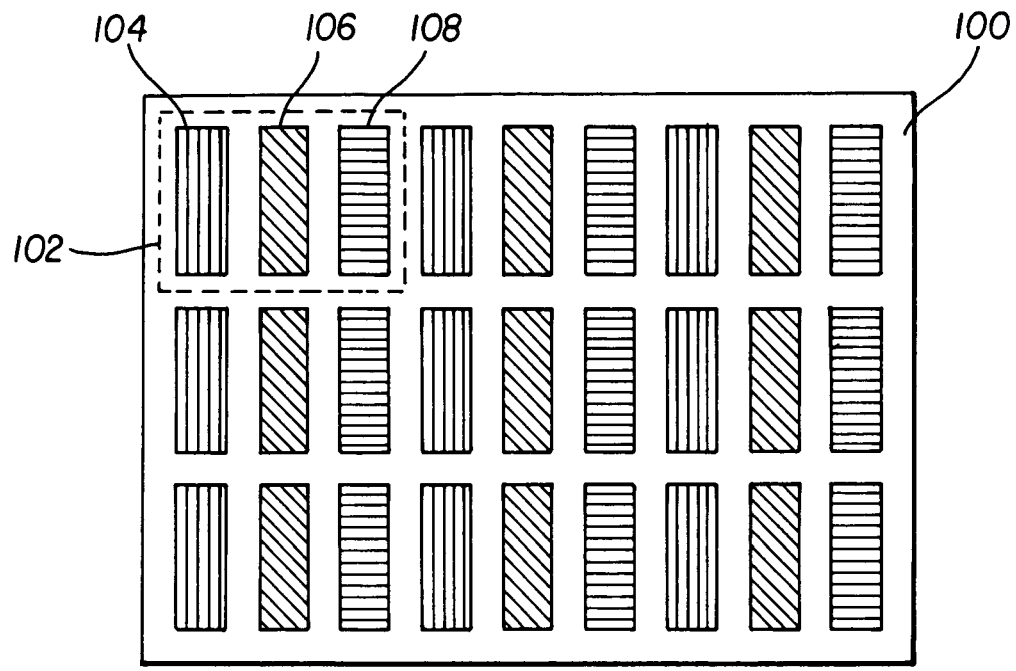
FIG. 6a is a schematic diagram illustrating a pattern of OLEDs arranged in one possible pixel pattern according to an embodiment of the present invention.
Figure 6B:
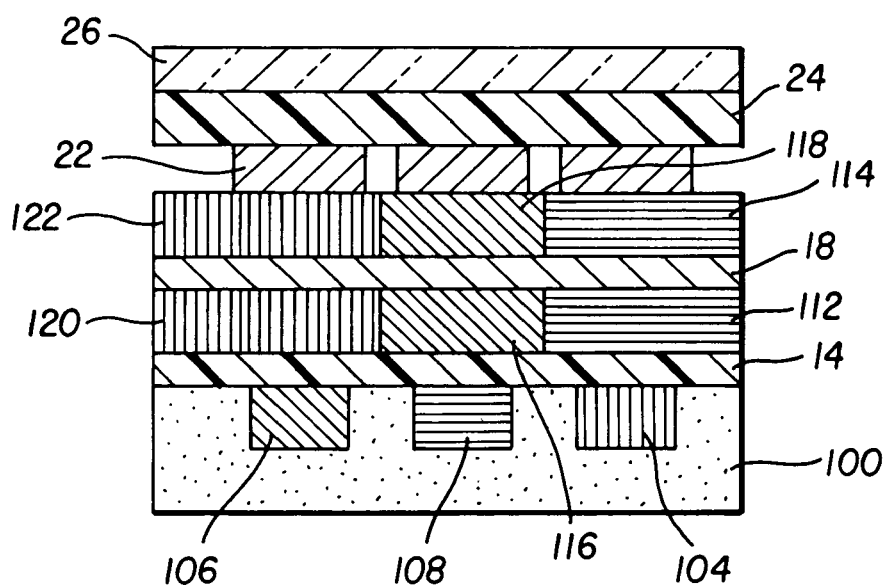

It is also known, however, that by varying the proportion of chiral compound present in the liquid crystal, selective reflection of the liquid crystal can be achieved for any wavelength within the infrared and color spectrums. Therefore, a color display may be formed as shown in FIGS. 6a and 6b. FIG. 6a shows the top view of a color display device 100 that is composed of a two-dimensional array of pixels 102. Each pixel is typically composed of a red light emitting element 104, a green light emitting element 106, and a blue light emitting element 108. As shown in this figure, the color display device 100 may be constructed using a stripe arrangement of red 104, green 106, and blue 108 light emitting elements in which each column of the display device contains light emitting elements of a single color. As shown earlier in FIG. 2, a linear polarizing layer 14 is optionally applied over the light emitting elements. FIG. 6b shows a horizontal cross section of the display device depicted in FIG. 6a. Note that in this display device the circular polarizer and the switchable half wave plate for the red, green, and blue light emitting elements are each patterned from three different materials, each of which has an intrinsic spectral bandwidth that is centered near the peak of the underlying red, green, or blue light emitting element. Therefore, the intrinsic spectral bandwidth of the materials used to form the circular polarizer 112 and switchable half wave plate 114 over the blue light emitting element 108 has a centered at a lower wavelength than the circular polarizer 116 and switchable half wave plate 118 that is pattered over the green light emitting element 106. Further, the intrinsic spectral bandwidth of the materials used to form the circular polarizer 116 and switchable half wave plate 118 over the green light emitting element 106 is centered at a lower wavelength than the circular polarizer 120 and switchable half wave plate 122 that is pattered over the red light emitting element 104. The first electrical conductive layer 18 and second conductive layer 22 and other components are as shown in FIG. 2.

As discussed for the monochrome display, to create a stereoscopic display device when viewed through appropriate elements, every other pixel may be given a different handedness of the polarization from each other and this handedness of the polarization may be switched in each update cycle. However, the spatial frequency of the signal may be increased even further if every other column of light emitting elements are given a different handedness of the polarization, which is then reversed at each update cycle. As discussed earlier, the data input to the display device must be configured to provide right eye information when the handedness of polarization is such that it allows light to pass to the right eye of the observer and provides left eye information when the handedness of the polarization is such that it allows light to pass to the left eye of the observer. Also, this display device may be switched to a monoscopic display device by making the handedness of the polarization of each light emitting element the same across the entire display device.

It will further be recognized that while the color display device may be constructed with columns of circular polarizers and/or switchable half wave plates, individual circular polarizers and switchable half wave plates may be pattered over rows of light emitting elements, individual light emitting elements or any alternative, arrangement of light emitting element(s) that form a spatial pattern in the display device. When patterned in this way, the handedness of the polarization may be switched using any spatial arrangement. For example, the light emitting elements maybe addressed such that a checkerboard pattern of light emitting elements have one handedness of polarization and the remaining light emitting elements have a second handedness of polarization.

While the display device shown in FIG. 6a and FIG. 6b has red, green, and blue light emitting elements, the light emitting elements may be of other colors; including the secondary colors (e.g., yellow, cyan, magenta), white, etc. In some applications it may be advantageous to have light emitting elements that emit outside the visible spectrum, for example in the infrared spectral region. While red, green, and blue light emitting elements will typically have a peak emission near a single wavelength, secondary and other colors will typically have a spectrum that includes multiple spectral peaks at different parts of the visible spectrum. To insure that such light emitting elements will be polarized appropriately, the circular polarizing layer and/or the switchable half wave plate may be each be composed of multiple layers; each layer having a center wavelength that is matched to the peaks in the spectral emission of the light emitting elements. These layers will ideally be ordered such that the layers closest to the observer will have center frequencies that match the peaks that make the largest contribution to the luminance of the light emitting element.

While the use of high frequency segments may be employed to reduce the refresh rate required to avoid the perception of flicker; the user's sensitivity to flicker can be reduced further by only updating low luminance colors within each update cycle. Therefore, the required refresh rate can be further reduced by creating a color OLED display wherein each pixel has four light emitting elements where in two of the four light emitting elements have the same color. One of these two light emitting elements is used to display the appropriate colored light emitting element for the left eye while the other light emitting element is used to display the appropriate colored light emitting element for the right eye. These light emitting elements are not refreshed as described in FIG. 5 but display the appropriate information from each image buffer. Simultaneously, the remaining light emitting elements can be updated using the process discussed in FIG. 5. Since the contrast between states creates the perception of flicker, the fact that one colored pixel is not altered frame to frame further reduces the perception of flicker and the required update rate. To minimize the required update rate, the light emitting element that contributes the most to the luminance of the pixel should be consistent frame to frame.

The invention has been described with reference to a preferred embodiment. However, it will be appreciated that variations and modifications can be effected by a person of ordinary skill in the art without departing from the scope of the invention.

PARTS LIST 2 spatial-temporal tradeoff function
10 display device
12 light emitting element
14 linear polarizer
16 circular polarizer
18 first electrical conductive layer
20 switchable half wave plate
22 second electrical conductive layer
24 dielectric layer
26 protective layer
28 anti-glare coating
30 cathode layer
32 electron-transporting layer
34 light emitting layer
36 hole-transporting layer
38 hole-injecting layer
40 anode layer
42 substrate
50 image buffer for the left eye image
52 image buffer for the right eye image
54 pixel clock
60 loading left eye image step
62 loading right eye image step
64 setting first circular polarization for odd column step
66 clock left eye data into odd column step
68 setting second circular polarization for even column step
70 clock right eye data into even column step
72 determining if display has been filled step
74 setting second circular polarization for odd column step
76 clock right eye data into odd column step
78 setting first circular polarization for even column step
80 clock left eye data into even column step
82 determining if display has been filled step
100 color display device
102 pixel
104 red light emitting element
106 green light emitting element
108 blue light emitting element
112 circular polarizer for blue light emitting element
114 switchable half wave plate for blue light emitting element
116 circular polarizer for green light emitting element
118 switchable half wave plate for green light emitting element
120 circular polarizer for red light emitting element
122 switchable half wave plate for red light emitting element

What is claimed is:

1. A switchable stereoscopic display system, wherein the switchable stereoscopic display system can display three-dimensional images, comprising:

an organic light emitting diode (OLED) display device including a two-dimensional array of light emitting elements;

a first electronic means for rapidly updating individual OLEDs;

means for linearly polarizing light emitted from the two-dimensional array of light emitting elements in the OLED display device;

a circular polarizing layer capable of changing light from linearly polarized light to circular polarized light;

a polarization layer, on top of the circular polarization layer, and capable of switching a polarization direction of emitted light from a right-handedness to a left-handedness or alternatively switch polarization direction from a left-handedness to a right-handedness;

a second electronic means for causing the switching of polarization direction within independent segments of the polarization layer, during a first time period, wherein the emitted light from a first subset of the independent segments is provided either left-handedness polarization or right-handedness polarization and the emitted light from a second subset of the independent segments is provided an opposite polarization from the polarization of the first subset of independent segments, and during a second time period, polarization handedness of the first and second subset of independent segments reverses; and temporal synchronization means for synching refreshed OLEDs with the independent segments of the polarization layer such that individual OLEDs are switched synchronously with the polarization handedness of the independent segments allowing each individual OLED to provide high-resolution of image information and to reduce flickering of the image information, for a display user.

2. The switchable stereoscopic display system claimed in claim 1, wherein the polarization direction is common for each of the independent segments of the polarization layer enabling the viewer to perceive a non-degraded two-dimensional image.

3. The switchable stereoscopic display system, claimed in claim 1 wherein a viewing device is one or more pairs of eyewear for viewing the three-dimensional image.

4. The switchable stereoscopic display system claimed in claim 1, wherein the OLED display device is a monochrome display.

5. The switchable stereoscopic display system claimed in claim 1, wherein the OLED display device is a color display.

6. The switchable stereoscopic display system claimed in claim 5, wherein the OLED display device has individual patterned polarizing layers tuned to a peak wavelength for each individual color displayed by the OLED display device.

7. The switchable stereoscopic display system claimed in claim 6, wherein the individual colors are selected from the group consisting of red, green, blue, cyan, yellow, magenta, and white.

8. The switchable stereoscopic display system claimed in claim 1, wherein the independent segments of the polarization layer is aligned in columns.

9. The switchable stereoscopic display system claimed in claim 1, wherein the independent segments of the polarization layer is aligned in rows.

10. The switchable stereoscopic display system claimed in claim 1, wherein the independent segments of the polarization layer is aligned OLED by OLED.

11. The switchable stereoscopic display system claimed in claim 1, wherein the means for linearly polarizing the light emitted from the OLED display device is a linearly polarizing layer.

12. The switchable stereoscopic display system claimed in claim 1, wherein the means for linearly polarizing the light emitted from the OLED display device includes light-emitting elements arranged in a predetermined spatial pattern within the OLED display device.

13. The switchable stereoscopic display system claimed in claim 1, wherein the switching of individual OLEDs are refreshed in the range of 15 to 70 hertz, producing an image without perceptible flicker.

14. The switchable stereoscopic display system claimed in claim 1, wherein the synchronization means includes synching the polarization direction of the independent segments of the polarizing layer to the refresh rate of the OLEDs covered by said independent segments.

15. A stereoscopic display system claimed in claim 1, wherein the circular polarizing means andior the switchable polarizing layer are patterned of materials with center frequencies that are tuned to be equal to the center frequency of the light emitting element.

16. The stereoscopic display system claimed in claim 6, wherein at least one individual OLED emits infrared light.

* * * * *